United States Patent [19]

Kruchowski et al.

[11] Patent Number: 4,786,392
[45] Date of Patent: Nov. 22, 1988

[54] FIXTURE FOR CLEANING A PLASMA ETCHER

[75] Inventors: James N. Kruchowski, Eau Claire, Wis.; Robert K. Sakurai, Minneapolis, Minn.

[73] Assignee: Unisys Corporation, Blue Bell, Pa.

[21] Appl. No.: 41,465

[22] Filed: Apr. 23, 1987

[51] Int. Cl.[4] .............................................. C23C 14/00
[52] U.S. Cl. .................................. 204/298; 204/192.32; 156/345
[58] Field of Search ........................ 134/1, 22.1; 204/192.32, 298; 156/345

[56] References Cited

U.S. PATENT DOCUMENTS

| | | | |
|---|---|---|---|
| 4,422,407 | 12/1983 | Bessot et al. | 204/298 |
| 4,576,698 | 3/1986 | Gallagher et al. | 204/298 |
| 4,578,554 | 3/1986 | Hijikata et al. | 204/298 |
| 4,657,616 | 4/1987 | Benzing et al. | 204/298 |

Primary Examiner—T. Tung
Assistant Examiner—Steven P. Marquis
Attorney, Agent, or Firm—Charles J. Fassbender; L. J. Marhoefer

[57] ABSTRACT

A fixture is provided which cleans a plasma etcher of a type that has a holding member with a surface which holds wafers that are to be etched, and an enclosing member which encloses the holding member to form a chamber for the plasma. This fixture operates to produce a large voltage change near the enclosing member and thereby enable the cleaning of the enclosing member by the plasma itself. To achieve such a large voltage change, the fixture is configured to fit inside of the enclosing member, provide a surface which is substantially larger than the surface of the holding member, and make electrical contact with the surface of the holding member. Preferably, the surface provided by the fixture is at least 50% larger than the surface of the holding member.

10 Claims, 3 Drawing Sheets

FIXTURE FOR CLEANING A PLASMA ETCHER

BACKGROUND OF THE INVENTION

This invention relates to plasma etchers which are used to make integrated circuits; and more particularly, it relates to fixtures for use in cleaning such etchers.

A cross section of a prior art plasma etcher 10 which the present invention can clean is shown in FIG. 1. This plasma etcher 10 includes a holding member 11, an enclosing member 12, gas ducts 13, a voltage generator 14, a capacitor 15, and an insulator 16 which electrically separates members 11 and 12. Typically, member 12 is bell jar shaped and is about three feet high and three feet in diameter. Also typically, member 11 is hexode shaped and is less than half the size of member 12.

In operation, the enclosing member 12 is opened (such as by lifting it off its base 12a), and integrated circuit wafers 17 which are to be etched are placed on the holding member 11. Thereafter the enclosing member 12 is closed and various gases which form a plasma 18 are introduced via the ducts 13 into the space which member 12 encloses. Generator 14 then generates a voltage at a radio frequency (such as 13.55 MHz) which together with capacitor 15 causes a DC bias voltage to be built up in the plasma 18.

Curve 20 in FIG. 2 shows how the bias voltage in plasma 18 varies between the enclosing member 12 and holding member 11. That bias voltage starts at 0 volts on the surface of the enclosing member 12; then it quickly increases to about 30 volts as the plasma is entered; then it stays constant until the surface of holding member 11 is nearly reached; and then it quickly drops to about −500 volts on the surface of member 11. Such a large voltage change near holding member 11 is very desirable because it accelerates the ions in plasma 18 towards the wafers 17 with a high velocity to thereby produce the desired wafer etch.

By comparison, only a small change occurs in the voltage bias near the enclosing member 12. Consequently, the plasma ions are only accelerated slowly towards the enclosing member, and that enables the plasma ions to attach themselves to the enclosing member and gradually build up as a polymer film 19. This film 19 must be periodically cleaned off of member 12 or it will adversely affect the etching of the wafers. For example, the presence of film 19 will decrease the etch rate of the wafers, and particles of film 19 can fall off into the plasma and contaminate the wafers.

In the prior art, the film 19 was removed by a workman who would open the enclosing member 12 and physically scrub the film off. However, such a removal process can be very hazardous because the chemicals which form plasma 18 and the film 19 usually are toxic. For example, plasmas containing methane and chlorine are used to etch metal; and plasmas containing methane and fluorine are used to etch $SiO_2$. Consequently, the workman who scrubs off the film 19 must wear a gas mask and protective clothing.

Accordingly, a primary object of the invention is to provide a fixture for cleaning plasma etchers in a less hazardous fashion.

BRIEF SUMMARY OF THE INVENTION

With the present invention, a fixture is provided which cleans a plasma etcher of a type that has a holding member with a surface which holds wafers that are to be etched, and an enclosing member which encloses the holding member to form a chamber for the plasma. This fixture operates to produce a large voltage change near the enclosing member and thereby enable the cleaning of the enclosing member by the plasma itself. To achieve this, the fixture is configured to fit inside of the enclosing member, provide a surface which is substantially larger than the surface of the holding member, and make electrical contact with the surface of the holding member. Preferably, the surface provided by the fixture is at least 50% larger than the surface of the holding member.

BRIEF DESCRIPTION OF THE DRAWINGS

A preferred embodiment of the invention is described herein in conjunction with the accompanying drawings wherein.

DETAILED DESCRIPTION OF THE INVENTION

Figure 1:
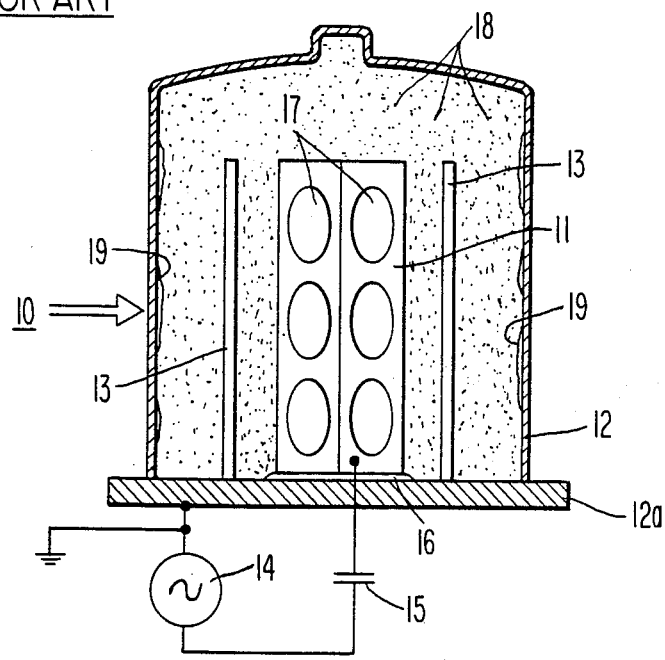
FIG. 1 is a sectional view of a plasma etcher of the prior art which the present invention can clean.
Figure 2:
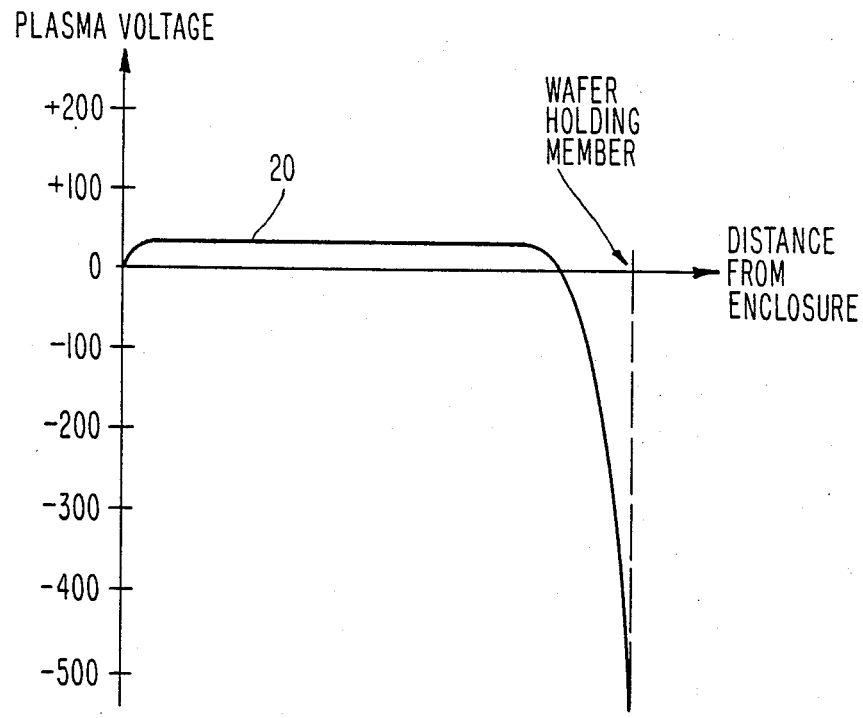
FIG. 2 illustrates how the plasma voltage varies in the etcher of FIG. 1.
Figure 3:
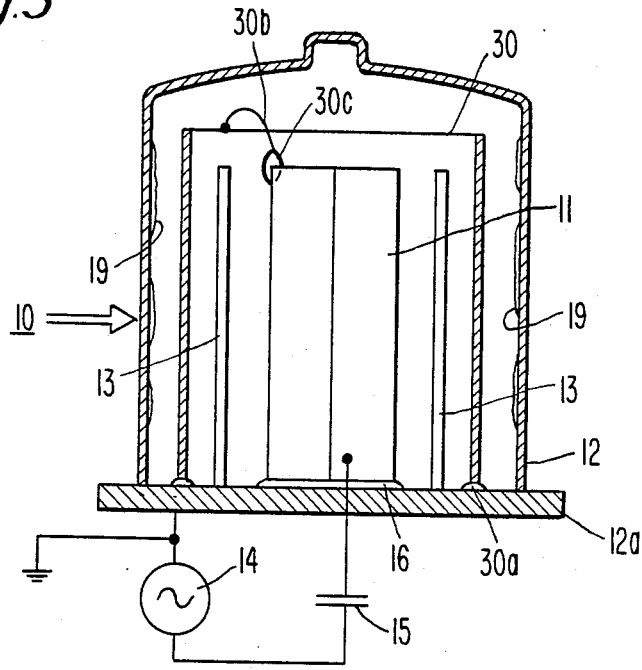
FIG. 3 illustrates a fixture which is constructed according to the invention and which is placed in an operating position in the reactor of FIG. 1.

Referring now to FIG. 3, it shows a fixture 30 which is constructed in accordance with the present invention and which is in an operating position within the previously described plasma etcher 10. As FIG. 3 shows, fixture 30 is configured to fit inside of the etcher's enclosing member 12, provide a surface which is substantially larger than the surface of the holding member 11, and make electrical contact with the holding member 11.

In the illustrated embodiment, fixture 30 is shaped as a cylindrical tube whose diameter is large enough to enable the holding member 11 and gas ducts 13 to fit inside of the tube. Fixture 30 consists essentially of a metal, such as steel, except for its base 30a which is an insulator that electrically separates the fixture from the enclosing member 12. Electrical contact between fixture 30 and holding member 11 is provided by a flexible conductor 30b which has a clamp 30c that attaches to member 11 in a removable fashion.

In operation, a gas (such as oxygen) is introduced via the ducts 13 into the space that member 12 encloses, and generator 14 produces a radio frequency voltage (such as 13.55 MHz) to form a plasma. As a result, a DC bias voltage is built up in the plasma 18. However, due to the presence of fixture 30, this plasma voltage has a large gradient near the surface of the enclosing member 12.

Figure 4:
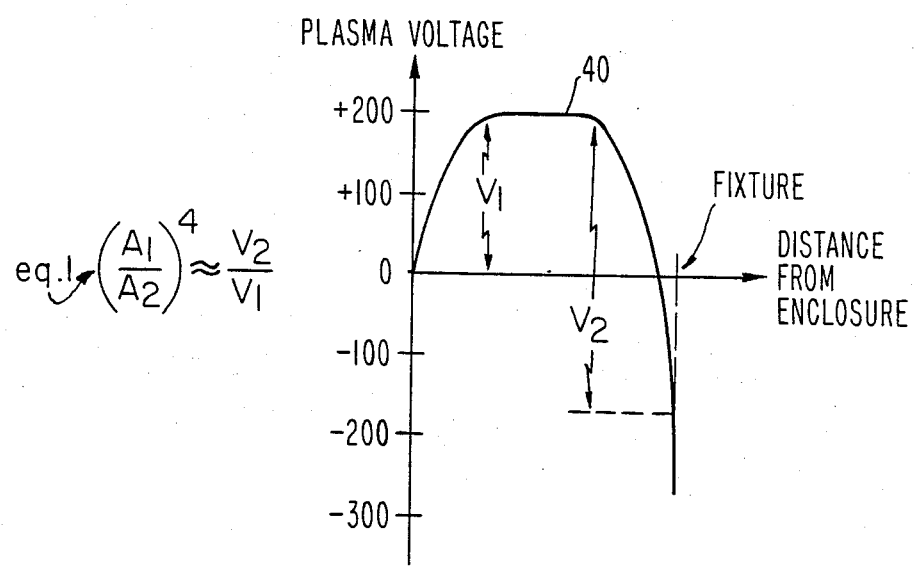
FIG. 4 illustrates the operation of the fixture in FIG. 3.

Curve 40 in FIG. 4 shows how the plasma voltage varies function of distance within the FIG. 3 structure. That bias voltage starts at 0 volts on the surface of the enclosing member 12; then it quickly increases to about 200 volts as the plasma is entered; then it stays constant until the surface of fixture 30 is nearly reached; and then it quickly drops to a negative voltage. Since the voltage change is large near the enclosing member 12, the plasma ions will be accelerated towards that member with a high velocity and thereby etch film 19 off of its surface.

Equation 1 in FIG. 4 relates the two voltage changes that occur in the plasma to the respective areas of member 12 and fixture 30. In this equation, $A_1$ is the area of fixture 30; $A_2$ is the area of the enclosing member 12; $V_1$ is the voltage change that occurs in the plasma near fixture 30; and $V_2$ is the voltage change that occurs in the plasma near the enclosing member 12. With the enclosed fixture 30, area $A_1$ can be made greater than 75% of the area $A_2$.

By comparison, when fixture 30 is removed from the etcher, equation 2 still applies but $A_1$ becomes the area of holding member 11 and $V_1$ becomes the voltage change that occurs in the plasma near the holding member. But area $A_1$ of holding member 11 is always made much smaller than area $A_2$ of the enclosing member 12 so that the voltages $V_1$ and $V_2$ will greatly differ and large voltage gradient for accelerating ions will occur near the wafers on the holding member.

A preferred embodiment of the invention has now been described in detail. In addition, however, many changes and modifications can be made to these details without departing from the nature and the spirit of the invention.

Figure 5A:
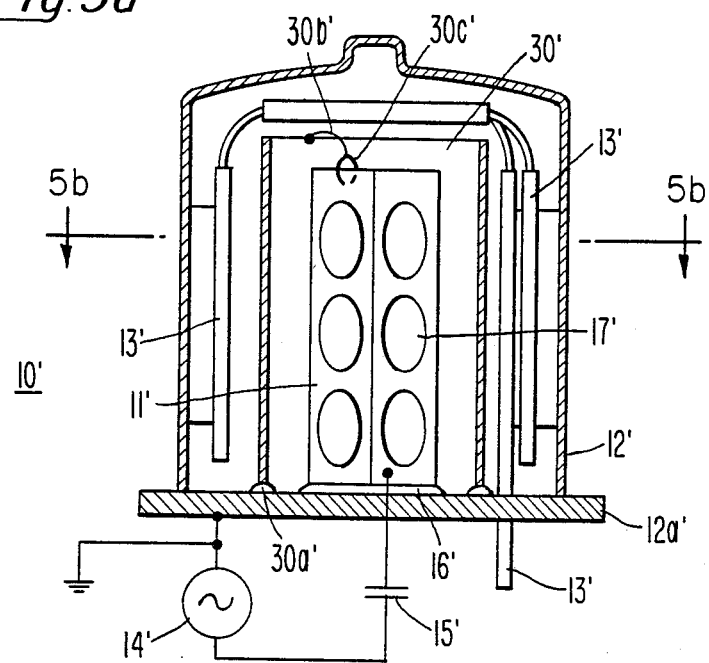
FIGS. 5A and 5B illustrate another fixture which is constructed according to the invention.
Figure 5B:
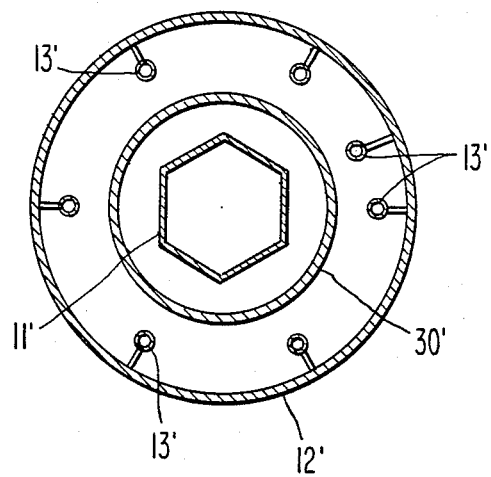

For example, FIGS. 5A and 5B show another fixture 30' that is constructed according to the invention and which is adapted to fit inside of another plasma etcher 10'. This etcher 10' has components 11' thru 16' which are similar to the previously described components 11 thru 16. However, the gas ducts 13' are mechanically attached to (yet electrically insulated from) the sidewalls of the enclosing member 12'. To accommodate these ducts, the fixture 30' is shaped to fit between them and holding member 11, and still have a much larger surface area than the holding member.

Accordingly, since many such changes are possible, it is to be understood that the invention is not limited to illustrated embodiments but is defined by the appended claims.

What is claimed is:

1. A fixture, in combination with a plasma etcher which comprises a holding member with a surface which holds wafers that are to be etched, and an enclosing member which encloses said holding member to form a chamber for said plasma;

said fixture operating to produce a large voltage gradient in said plasma near said enclosing member and thereby enable the cleaning of said enclosing member by said plasma;

said fixture being configured to fit inside of said enclosing member, provide a metal surface which surrounds said holding member and is substantially larger than said surface of said holding member, and includes a means shorting said metal surface to said holding member.

2. A fixture plasma etcher combination according to claim 1 wherein said metal surface is shaped as a cylinder which fits over and surrounds said holding member.

3. A fixture plasma etcher combination according to claim 2 wherein said cylinder shaped metal surface has a base which is made of an electrical insulator.

4. A fixture plasma etcher combination according to claim 3 wherein said metal surface of said fixture is at least 50% larger than said surface of said holding member.

5. A fixture plasma etcher combination according to claim 3 wherein said means for shorting is a metal conductor having one end that is fixedly attached to said cylinder and has another end with a fastener for engaging said holding member in a readily removable fashion.

6. A fixture, in combination with a plasma etcher in which the potentials within said etcher are related by the equation $(A_1/A_2)^4 \approx (V_2/V_1)$ where $A_1$ is a small surface which holds wafers that are to be etched, $A_2$ is a large surface which encloses said plasma, $V_1$ is a voltage change which occurs in said plasma near surface $A_1$, and $V_2$ is a voltage change which occurs in said plasma near surface $A_2$; said fixture being configured to fit inside of the enclosure provided by surface $A_2$, provide a metal surface which surrounds surface $A_1$, and which is substantially larger than surface $A_1$, and includes a metal conductor shorting said metal surface to said surface $A_1$.

7. A fixture plasma etcher combination according to claim 6 wherein said metal surface is shaped as a cylinder which fits over and surrounds surface $A_1$.

8. A fixture plasma etcher combination according to claim 7 wherein said metal surface of said fixture is at least 50% larger than surface $A_1$.

9. A fixture plasma etcher combination according to claim 6 wherein said metal surface has a base which is made of an electrical insulator.

10. A fixture plasma etcher combination according to claim 6 wherein said electrical conductor is a flexible conductor having one end fixedly attached to said metal surface and having another end with a fastener for engaging surface $A_1$ in a readily removable fashion.

* * * * *